(12) United States Patent
Fischer

(10) Patent No.: US 8,760,326 B2
(45) Date of Patent: Jun. 24, 2014

(54) METHOD FOR DATA TRANSMISSION TO AN ELECTRONIC CONTROL UNIT

(75) Inventor: Uwe Fischer, Schwaikheim (DE)

(73) Assignee: Knorr-Bremse Systeme fuer Nutzfahrzeuge GmbH, Munich (DE)

( * ) Notice: Subject to any disclaimer, the term of this patent is extended or adjusted under 35 U.S.C. 154(b) by 116 days.

(21) Appl. No.: 13/581,251

(22) PCT Filed: Feb. 23, 2011

(86) PCT No.: PCT/EP2011/052670
§ 371 (c)(1),
(2), (4) Date: Dec. 3, 2012

(87) PCT Pub. No.: WO2011/104268
PCT Pub. Date: Sep. 1, 2011

(65) Prior Publication Data
US 2013/0070837 A1    Mar. 21, 2013

(30) Foreign Application Priority Data
Feb. 25, 2010  (DE) .................. 10 2010 009 263

(51) Int. Cl.
*H03M 7/40*         (2006.01)
(52) U.S. Cl.
CPC ...................................... *H03M 7/40* (2013.01)
USPC .............................................. 341/65; 341/67
(58) Field of Classification Search
CPC ..... H03M 7/40; H03M 7/405; H03M 7/4037; H03M 7/4043; H03M 69/04
USPC ...................................................... 341/65, 67
See application file for complete search history.

(56) References Cited

U.S. PATENT DOCUMENTS

| | | | | |
|---|---|---|---|---|
| 4,853,696 A * | 8/1989 | Mukherjee | ...................... | 341/65 |
| 5,550,542 A * | 8/1996 | Inoue | .............................. | 341/67 |
| 6,563,441 B1 * | 5/2003 | Gold | .............................. | 341/67 |
| 7,043,088 B2 * | 5/2006 | Chiu et al. | .................... | 382/233 |

(Continued)

FOREIGN PATENT DOCUMENTS

| | | |
|---|---|---|
| DE | 699 16 661 | 8/2004 |
| DE | 39 43 881 | 7/2008 |
| DE | 10 2008 052 955 | 5/2010 |

OTHER PUBLICATIONS

Salomon : "data compression the complete reference", 2007, springer, XP002653994, pp. 74-81.

(Continued)

*Primary Examiner* — Khai M Nguyen
(74) *Attorney, Agent, or Firm* — Kenyon & Kenyon LLP

(57) ABSTRACT

A method for data transmission from a programming device to a control unit, the data being compressed by Huffman coding and transmitted with a Huffman coding tree for decoding from the programming device to the control unit, are decompressed and stored in the control unit, by performing, for a predetermined number of data words of N-bits, a first Huffman coding with a first coding tree; performing, for the remaining data words consisting of M-bits, a second Huffman coding with a second coding tree, N greater than M, the predetermined number of data words of N-bits and the remaining data words of M-bits consisting of more than two data words, generating coding trees for the N-bit and the M-bit data words, and transmitting them to the control unit, and providing all coded N-bit data words and N/M of successive M-bit data words with a preceding code bit.

10 Claims, 2 Drawing Sheets

(56) References Cited

U.S. PATENT DOCUMENTS

| | | |
|---|---|---|
| 7,937,413 B2 * | 5/2011 | Tran et al. .................. 707/803 |
| 2007/0016406 A1 | 1/2007 | Thumpudi et al. |
| 2009/0174583 A1 | 7/2009 | Diaz-Gutierrez et al. |

OTHER PUBLICATIONS

Salomon : "data compression the complete rererence", 2007, springer, XP002653995, pp. 886-887.

Quackenbush S R et al : "Noiseless coding of quantized spectral components in MPEG-2 Advanced Audio Coding", Applications of Signal Processing to Audio and Acoustics, 1997. 1997 IEEE ASSP Workshop on New Paltz, NY, USA Oct. 19-22, 1997, New York, NY, USA, IEEE, US, Oct. 19, 1997, p. 4PP, XP010248193, isbn : 978-0-7803-3908-8.

Liebscher P. : "Current trends in the reprogramming of control units", Elektronik automotive Feb. 2006, pp. 34-37.

Decker, Th. : "Lecture &: Huffman"; in: Online library Wikipedia, Jan. 19, 1999, http://www.itec.uka.de/seminare/redundanz/vortrag06/ (seminars/redundancy/lecture06/).

European Patent Office, International Preliminary Report on Patentability, Aug. 28, 2012, from International Patent Application No. PCT/EP2011/052670, filed on Feb. 23, 2011.

European Patent Office, English Translation of International Preliminary Report on Patentability and Written Opinion, Aug. 28, 2012, from International Patent Application No. PCT/EP2011/052670, filed on Feb. 23, 2011.

* cited by examiner

METHOD FOR DATA TRANSMISSION TO AN ELECTRONIC CONTROL UNIT

FIELD OF THE INVENTION

The present invention relates to a method for data transmission from a programming device to an electronic control unit, especially to electronic control units of motor vehicles.

BACKGROUND INFORMATION

Such a method is discussed in the printed document Liebscher P.: "Aktuelle Trends bei der Steuergeräte-Reprogrammierung" (Current trends in the reprogramming of control units) in: Elektronik automotive 2.2006, pp. 34-37. The patent document DE 10 2008 052 955 A1, not previously published, also refers to the transmission of program codes to a memory of a control unit in which initially the program memory in the control unit is overwritten with invalid codes, subsequently, the program codes to be transmitted are compressed in accordance with the Huffman data compression method, transmitted, decompressed in the control unit and stored.

The printed document Decker, Th.: "Lecture &: Huffman"; in: Online library Wikipedia, 19.01.1999, http://www.itec.uka.de/seminare/redundanz/vortrag06/ (seminars/redundancy/lecture06/) and US 2007/0016406 A1, DE 39 43 881 B4 and DE 699 16 661 T2 discuss that the Huffman coding can be optimized by using as data words to be coded not only individual input data words but pairs/tuples of these input words.

Patent documents US 2007/0016406 A1 and DE 39 43 881 B4, additionally discuss switching over the Huffman codings used in dependence on the data currently to be coded, and this is done area-by-area within the data to be coded. Furthermore, a code bit for distinguishing between different coding variants is provided in DE 39 43 881 B4.

To transmit relatively large quantities of data within a justifiable time, it is known to compress the data to be transmitted. The very efficient loss-free Huffman coding is suitable for this purpose. The Huffman 16 coding, which operates with 16-bit data words, is very efficient but requires a relatively large coding tree for decoding (up to approx. 278 Kbytes). The size depends on the code utilization. Each 16-bit code used costs 34 bits in the coding tree for decoding. Correspondingly, the generation of the coding tree also takes a long time. In addition, the coding tree also has to be transmitted during the data transmission for the decoding and, due to its size, may no longer fit into the main memory of the destination system or control unit, respectively.

On the other hand, the Huffman 8 coding, which operates with 8-bit data words, manages with a smaller coding tree for the decoding (approx. 574 bytes) but does not achieve the efficiency of the Huffman 16 coding.

SUMMARY OF THE INVENTION

It is an object of the invention to improve the method according to the description herein to the extent that, with a high efficiency, it manages with smaller coding trees and, as a result, the data transmission is faster. Furthermore, the loading of the main memory of the control unit by the coding tree is to be reduced.

This object is achieved by the features described herein. Advantageous embodiments and developments of the invention are found in the further descriptions herein.

An aspect of the exemplary embodiments and/or exemplary methods of the present invention lies in performing the compression of the data to be transmitted partially by an N-bit Huffman coding and partially by M-bit Huffman coding, wherein N is an integral multiple M and the number of N-bit data words and the number of M-bit data words is in each case greater than 2 and furthermore both coding trees are transmitted to the control unit. In this case and in the text following, N-bit Huffman coding and M-bit Huffman coding are understood to be Huffman coding with a first and second coding tree, respectively, which codes data words consisting of N-bits and M-bits, respectively.

In an exemplary embodiment, a predetermined number of data words to be coded is compressed with the Huffman 16 coding, whereas the remaining data words are compressed with the Huffman 8 coding.

For the most frequent 16-bit data words, a separate coding table and a separate (first) coding tree are generated for the decoding, the number of data words being selected in such a manner that the size of the coding tree remains manageable. For all remaining codes, a (second) 8-bit Huffman tree is generated which can decode all codes from "0" to "255". Since the complete 8-bit coding tree for decoding only 574 bytes is large, it does not pay here to use an incomplete tree.

During the coding, a check is first made whether the 16-bit value found is contained in the 16-bit coding table. If not, the 8-bit table is used and the two bytes of the 16-bit word are coded.

For the decision about which coding tree is to be used for decoding, one bit is added during the coding. The coding tree can be used for arbitrary data since any data can be represented with the aid of the complete 8-bit trees.

In general, a 32-bit coding is also conceivable instead of the 16-bit coding mentioned, the method also being usable in principle for any other data sizes such as, e.g. 9-bit or 19-bit.

The primary field of application of the method according to the invention is the programming of electronic control units for motor vehicles and utility vehicles via a diagnostic interface. By compressing the data, considerable time can be saved in the development, in production and in the workshop.

By combining the two types of coding, the advantages of both coding trees can be utilized. The disadvantages of the low efficiency of the 8-bit coding and of the overlarge coding tree for the decoding of the 16-bit coding are compensated for. The transmission of the data via the diagnostic interface of a vehicle takes place in ascending order, which is necessary in some control units since it is not possible to write randomly into the memory, but only sector by sector. The coding trees for the decoding are small enough to be storable in the main memory of the destination system during the decoding. After that, the coding trees for decoding can be removed from the main memory so that the latter is available for other tasks. However, it is also possible to keep at least one of the coding trees for the decoding or even both coding trees for the decoding stored permanently in a non-volatile memory such as, e.g., a flash memory of the control unit. In the case of later changes of the data to be transmitted to the control unit, the coding trees do not normally change, or only slightly, so that no noticeable impairment occurs. Naturally, the coding tree originally used must then be used during later data changes.

In the text which follows, the invention will be described in greater detail by an exemplary embodiment, in conjunction with the drawings.

DETAILED DESCRIPTION

Figure 1:
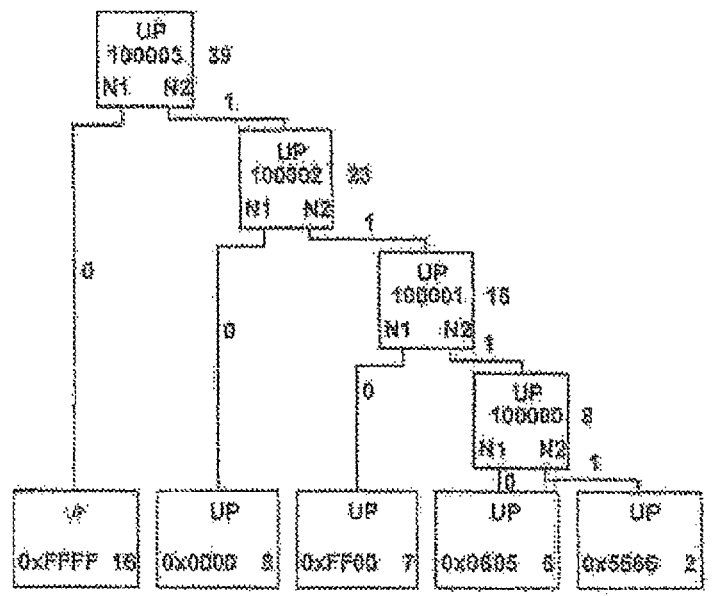
FIG. 1 shows a first coding tree for the 16-bit Huffman coding.

To distinguish hexadecimal numbers from primary and decimal numbers, the usual prefix 0x is used in order to identify hexadecimal numbers unless it is especially pointed out.

The following bytes starting from address 0x2000 have to be compressed, all values being hexadecimal numbers:

TABLE 1

| | | | | | | | | | | | | | | | | |
|---|---|---|---|---|---|---|---|---|---|---|---|---|---|---|---|---|
| 2000h: | FF | FF | FF | FF | FF | FF | FF | FF | FF | FF | FF | FF | FF | FF | FF | FF |
| 2010h: | FF | FF | FF | FF | FF | FF | FF | FF | FF | FF | FF | FF | FF | FF | FF | FF |
| 2020h: | FF | 00 | FF | 00 | FF | 00 | FF | 00 | FF | 00 | FF | 00 | FF | 00 | FF | 55 |
| 2030h: | 66 | 55 | 66 | 55 | 66 | 55 | 66 | 55 | 66 | 55 | 66 | 55 | 00 | 55 | 00 | 55 |
| 2040h: | 00 | 00 | 00 | 00 | 00 | 00 | 00 | 00 | 00 | 00 | 00 | 00 | 00 | 00 | 00 | 00 |
| 2050h: | 01 | 02 | 02 | 01 | 05 | 06 | 06 | 05 | 06 | 05 | 12 | 34 | 56 | 78 | 90 | AA | resulting in the following frequencies:

TABLE 2

| VALUE (Hex) | FFFF | 0000 | FF00 | 6655 | 0605 | 0055 | 90AA | FF55 | 0102 | 1234 | 0201 | 0506 | 5678 |
|---|---|---|---|---|---|---|---|---|---|---|---|---|---|
| FREQUENCY (Dec) | 16 | 8 | 7 | 6 | 2 | 2 | 1 | 1 | 1 | 1 | 1 | 1 | 1 | containing the following 8-bit values:

TABLE 3

| VALUE (Hex) | FF | 00 | 55 | 66 | 05 | 06 | 02 | 01 | 34 | 56 | 78 | 90 | AA |
|---|---|---|---|---|---|---|---|---|---|---|---|---|---|
| FREQUENCY (Dec) | 40 | 35 | 9 | 6 | 3 | 3 | 2 | 2 | 1 | 1 | 1 | 1 | 1 |

A number x (where x=5 in the example described) of the 16-bit words occurring more frequently is then determined which is subjected to 16-bit coding. However, the number x is smaller than $2^N$, so that not all 16-bit values are subjected to the 16-bit coding and a number of 8-bit values remain, that is to say 16-bit coding is incomplete, so that the 16-bit coding tree and the corresponding 16-bit coding tree for decoding do not become too long. Values for x from 100 to 200 are considered to be advantageous.

Since the 8-bit values occurring are partially contained in the 16-bit values, the frequencies of the 8-bit values must be corrected. In this context, attention must be paid to the fact that both the higher-value byte and the lower-value byte of the 16-bit values are taken into consideration. For example, the frequency of 0xFF (8-bit) is reduced by two with each occurrence of 0xFFFF (16-bit), by one with each occurrence of 0xFF00.

Without this correction, a short Huffman code would result, for example for the 66, although this 8-bit value does not occur at all. (Because it has been absorbed in the 16-bit value 6655.) The following corrections are then obtained for the frequency of the 8-bit values.

TABLE 4

| VALUE (Hex) | FF | 00 | 55 | 66 | 05 | 06 | 02 | 01 | 34 | 56 | 78 | 12 | 90 | AA |
|---|---|---|---|---|---|---|---|---|---|---|---|---|---|---|
| FREQUENCY (Dec) | 40 | 35 | 9 | 6 | 3 | 3 | 2 | 2 | 1 | 1 | 1 | 1 | 1 | 1 |
| Reduce by | 39 | 23 | 6 | 6 | 2 | 2 | 0 | 0 | 0 | 0 | 0 | 0 | 0 | 0 |
| Corrected frequency | 1 | 2 | 3 | 0 | 1 | 1 | 2 | 2 | 1 | 1 | 1 | 1 | 1 | 1 |

The frequency "0" must not occur for the generation of the coding tree, since otherwise a generation would not be possible. For this reason, all frequencies having the value "0" are set to "1" in order to force complete 8-bit coding trees and coding trees for the decoding. So that, as a result, however, symbols not occurring do not receive an equally "good" space in the coding tree as symbols occurring rarely or only once, the frequencies of the symbols actually occurring are multiplied by a factor, for example by a factor of 100. This then results in the following re-sorted 8-bit values:

TABLE 5

| VALUE (Hex) | 55 | 00 | 02 | 01 | FF | 05 | 06 | 34 | 56 | 12 | 78 | 90 | AA | 66 |
|---|---|---|---|---|---|---|---|---|---|---|---|---|---|---|
| Corrected frequency | 3 | 2 | 2 | 2 | 1 | 1 | 1 | 1 | 1 | 1 | 1 | 1 | 1 | 0 |

TABLE 5-continued

| VALUE (Hex) | 55 | 00 | 02 | 01 | FF | 05 | 06 | 34 | 56 | 12 | 78 | 90 | AA | 66 |
|---|---|---|---|---|---|---|---|---|---|---|---|---|---|---|
| After multiplication | 300 | 200 | 200 | 200 | 100 | 100 | 100 | 100 | 100 | 100 | 100 | 100 | 100 | 1 |

Since the ratio of frequencies with respect to one another remains equal, the coding tree generated and the codes generated do not change when all 8-bit values occur.

In the example shown, this mechanism has a very strong effect but does not have any significance if all 8-bit values also occur in data.

Now, two mutually independent coding trees are generated, namely a coding tree for 16-bit values and a coding tree for 8-bit values.

The 16-bit coding tree is generated here only for the first 5 values according to frequency, to provide a clear representation, that is to say the values FFFF, 0000, FF00, 6655 and 0605 in the example, as shown in FIG. 1.

Figures 2, 4:
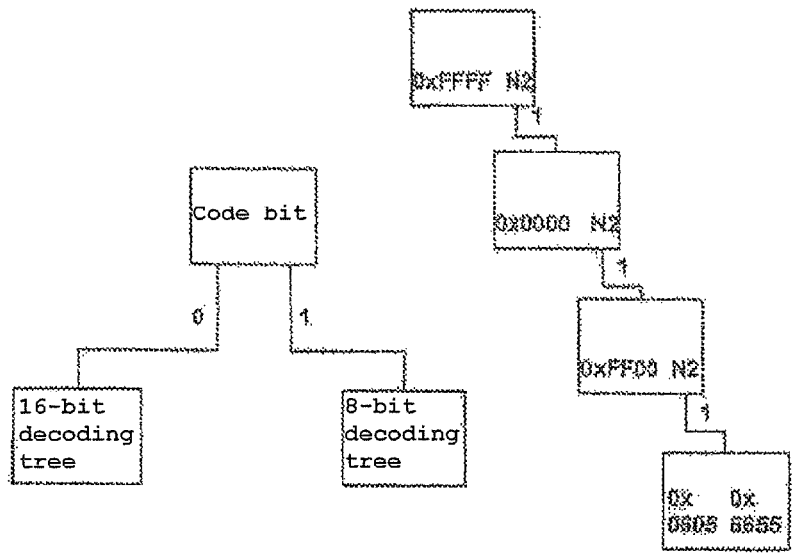
FIG. 2 shows a 16-bit coding tree for the decoding for the exemplary embodiment of FIG. 1.
FIG. 4 shows a coding tree for the decoding using an 8-bit and a 16-bit part-coding tree for the decoding.

The corresponding coding tree for the decoding thereof is shown in FIG. 2.

Figure 3:
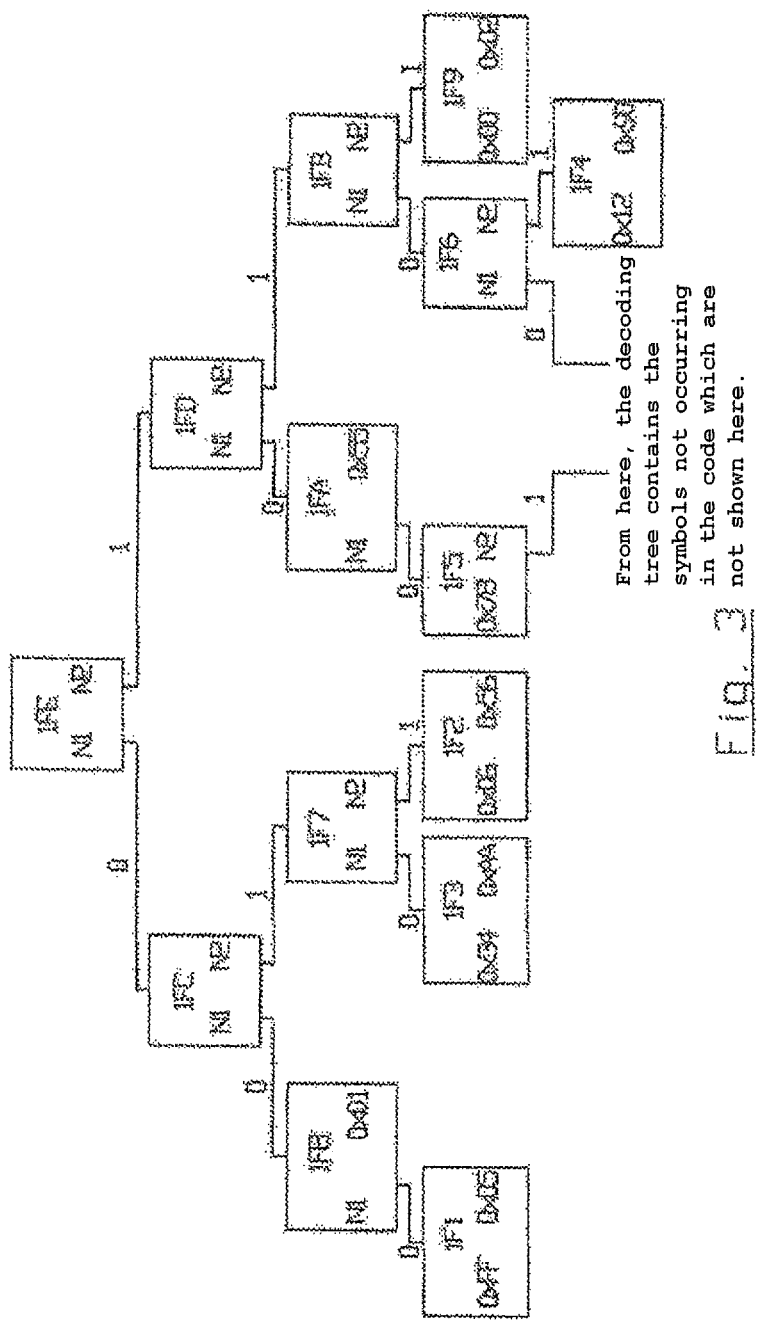
FIG. 3 shows a second coding tree for the 8-bit Huffman coding.

For all 8-bit values, a complete 8-bit coding tree is generated which is shown in FIG. 3 only for the 8-bit values occurring. This results in the following coding tables:

TABLE 6

Coding table M = 8-bit
Only shown for the symbols occurring

| Value | Length | Code |
|---|---|---|
| 55 | 3 | 101 |
| 02 | 4 | 1111 |
| 00 | 4 | 1110 |
| 01 | 3 | 001 |
| 78 | 4 | 1000 |
| 90 | 5 | 11011 |
| 12 | 5 | 11010 |
| AA | 4 | 0101 |

TABLE 6-continued

Coding table M = 8-bit
Only shown for the symbols occurring

| Value | Length | Code |
|---|---|---|
| 34 | 4 | 0100 |
| 56 | 4 | 0111 |
| 06 | 4 | 0110 |
| 05 | 4 | 0001 |
| FF | 4 | 0000 |

TABLE 7

Coding table N = 16-bit
16-bit symbols not occurring are coded as two 8-bit symbols

| Value | Length | Code |
|---|---|---|
| FFFF | 1 | 0 |
| 0000 | 2 | 10 |
| FF00 | 3 | 110 |
| 6655 | 4 | 1111 |
| 0605 | 4 | 1110 |

During the coding, it is first attempted to code each 16-bit word as such. If it does not occur in the 16-bit table, both halves are individually coded as 8-bit value. Thus, 8-bit values always occur in pairs here or, putting it more generally, N/M-times.

For the purpose of distinction, a "0" is inserted before each 16-bit value as "code bit", and a "1" if two 8-bit values follow.

The example of Table 1 thus results

TABLE 8

| Raw Data | | Code bit | FF | FF | Code bit | FF | FF | Code bit | FF | FF | Code bit | FF | FF | Code bit | FF | FF |
|---|---|---|---|---|---|---|---|---|---|---|---|---|---|---|---|---|
| Coded | | 0 | 0 | | 0 | 0 | | 0 | 0 | | 0 | 0 | | 0 | 0 | |
| Raw Data | | | FF | FF | | FF | FF | | FF | FF | | FF | FF | | FF | FF |
| Coded | | 0 | 0 | | 0 | 0 | | 0 | 0 | | 0 | 0 | | 0 | 0 | |
| Raw Data | | | FF | 00 | | FF | 00 | | FF | 00 | | FF | 00 | | FF | 00 |
| Coded | | 0 | 110 | | 0 | 110 | | 0 | 110 | | 0 | 110 | | 0 | 110 | |
| Raw Data | | | 66 | 55 | | 66 | 55 | | 66 | 55 | | 66 | 55 | | 66 | 55 |
| Coded | | 0 | 1110 | | 0 | 1110 | | 0 | 1110 | | 0 | 1110 | | 0 | 1110 | |
| Raw Data | | | 00 | 00 | | 00 | 00 | | 00 | 00 | | 00 | 00 | | 00 | 00 |
| Coded | | 0 | 10 | | 0 | 10 | | 0 | 10 | | 0 | 10 | | 0 | 10 | |
| Raw Data | | | 01 | 02 | | 02 | 01 | | 05 | 06 | | 06 | 05 | | 06 | 05 |
| Coded | | 1 | 001 | 1111 | 1 | 1111 | 001 | 1 | 0001 | 0110 | 0 | 1110 | | 0 | 1110 | |

| | | Raw Data | Code bit | FF | FF | Code bit | FF | FF | Code bit | FF | FF |
|---|---|---|---|---|---|---|---|---|---|---|---|
| | | Coded | 0 | 0 | | 0 | 0 | | 0 | 0 | |
| | | Raw Data | | FF | FF | | FF | FF | | FF | FF |
| | | Coded | 0 | 0 | | 0 | 0 | | 0 | 0 | |
| | | Raw Data | | FF | 00 | | FF | 00 | | FF | 55 |
| | | Coded | 0 | 110 | | 0 | 110 | | 1 | 0000 | 101 |
| | | Raw Data | | 66 | 55 | | 00 | 55 | | 00 | 55 |
| | | Coded | 0 | 1110 | | 1 | 1110 | 101 | 1 | 1110 | 101 |
| | | Raw Data | | 00 | 00 | | 00 | 00 | | 00 | 00 |
| | | Coded | 0 | 10 | | 0 | 10 | | 0 | 10 | |
| | | Raw Data | | 12 | 34 | | 56 | 78 | | 90 | AA |
| | | Coded | 1 | 11010 | 0100 | 1 | 0111 | 1000 | 1 | 11011 | 0101 |

The data thus coded and provided with code bit are then transmitted together with the associated coding trees for the decoding to the control unit and are there decoded by the coding trees for the decoding. If the coding trees for the decoding are already stored in the control unit due to prior programming, the transmission of the coding trees for the decoding is naturally omitted, in which case the original coding trees must then be used for the coding.

During the decoding, either one 16-bit value or two 8-bit values are always decoded. Single 8-bit values are not decoded because this would not bring any advantage. The alignment of the microcontroller codes at 16-bit boundaries and the necessity for an additional coding bit for each 8-bit code would result in degradation of the compression.

FIG. 4 shows that the bit (code bit) set in front of the coded values decides whether the 16-bit decoding (for a 16-bit value) or the 8-bit decoding (for two successive 8-bit values) is carried out. If this bit is a "0", the 16-bit coding tree is used for the decoding, if it is a "1", the 8-bit coding tree is used for the decoding. The respective decoding of a data word is always completed when the last "leaf" is reached in the coding tree for the decoding, the 8-bit coding tree being run through twice for the decoding after occurrence of the "1" code bit.

The coding tree for the decoding for the 8-bit values is shown in FIG. 3. In FIGS. 1 to 3, hexadecimal values are in each case identified by the prefix 0x.

The above shows that the size of the 16-bit coding tree and of the associated 16-bit coding tree for the decoding has a significant influence. Any arbitrary enlargement of the 16-bit coding tree for the decoding can be counterproductive and lead to poorer compression. This is illustrated using the following example:

An additional entry in the coding tree for the decoding uses 34 bits.

The coding of the two 8-bit values uses 6+8+1=15 bits.

The coding of a 16-bit value uses 12+1=13 bits.

For each two bytes, four bits are thus saved. To neutralize the additional 34 bits, the 16-bit value must occur at least 17 times in this mathematical example. To check this, partially large files would have to be calculated through, since the length of the coded symbols is not constant.

The optimum values depend on the data present in each case. The table 6 following shows on the basis of the original size of a file of 131072 bytes the relationship between the number of 16-bit codes, the number of compressed bytes including coding trees and the compression ratio in percent.

TABLE 9

| Number of 16-bit codes | Number of bytes compressed incl. coding trees | Percentage of 131072 bytes |
| --- | --- | --- |
| 78 | 55848 | 42.61% |
| 386 | 55433 | 42.29% |
| 152 | 55425 | 42.29% |
| 231 | 55309 | 42.20% |
| 295 | 55290 | 42.18% |
| 268 | 55266 | 42.16% |

A test application with an original size of 1179648 bytes shows that the compression ratio becomes even better with larger files.

TABLE 10

| Number of 16-bit codes | Number of bytes compressed incl. coding trees | Percentage of 1179648 bytes |
| --- | --- | --- |
| 1025 | 265977 | 22.55% |
| 635 | 263772 | 22.36% |
| 418 | 262473 | 22.25% |
| 335 | 261968 | 22.21% |
| 277 | 261654 | 22.18% |
| 240 | 261367 | 22.16% |
| 200 | 261118 | 22.14% |
| 42 | 261029 | 22.13% |
| 94 | 260973 | 22.12% |
| 165 | 260942 | 22.12% |
| 118 | 260929 | 22.12% |
| 65 | 260737 | 22.10% |
| 50 | 260717 | 22.10% |
| 56 | 260618 | 22.09% |

It can also be seen that the number of 16-bit codes has relatively little influence with files of this size. This is because the optimum parameters depend on the code distribution in the data to be compressed. Since in the case of greater volumes of data, the coding tree for the decoding is scarcely of importance, the number of 16-bit codes should not be selected to be too small. Values around 100 to 200 appear to be advantageous, generally any value of greater than 1 being possible.

The invention claimed is:

1. A method for providing data transmission from a programming device to a control unit, in which the data to be transmitted are compressed by a Huffman coding in the programming device, and, after the compression, are transmitted together with a Huffman coding tree for decoding from the programming device to the control unit, are decompressed in the control unit and are stored there, the method comprising:
performing, for a predetermined number of data words consisting in each case of N-bits of the data to be transmitted, a first Huffman coding with a first coding tree;
performing, for the remaining data words consisting in each case of M-bits, a second Huffman coding with a second coding tree, N being greater than M, wherein the predetermined number of data words consist of N-bits and the remaining data words consist of M-bits consisting of in each case more than two data words;
generating a coding tree for the N-bit data words to be coded, and generating a coding tree for the M-bit data words to be coded;
transmitting both of the coding trees to the control unit; and
providing all coded N-bit data words and N/M of successive M-bit data words in each case with a preceding code bit.

2. The method of claim 1, wherein the number N is an integral multiple of the number M.

3. The method of claim 2, wherein the number N is equal to 16 and the number M is equal to 8.

4. The method of claim 1, wherein both coding trees for decoding are deleted in the control unit after the decoding of the transmitted data.

5. The method of claim 1, wherein the number of data words which are subjected to the first Huffman coding is less than $2^N$.

6. The method of claim 1, wherein the code bit is a logical "0" for the data words which were subjected to the first Huffman coding and is a logical "1" for the data words subjected to the second Huffman coding.

7. The method of claim 1, wherein the coded data words consisting of N-bits are decoded individually and of the remaining coded data words consisting of M-bits, a number of N/M-bit words of this type is decoded thereafter.

8. The method of claim 1, wherein the frequency of the N-bit data words and M-bit data words occurring is determined before the coding, in that the number (x) of the N-bit data words is established, subsequently the number of M-bit data words not contained in the N-bit data words established is determined, subsequently the numbers of M-bit data words thus determined are multiplied by a correction factor, the number of M-bit data words having the value "0" being set to "1".

9. The method of claim 8, wherein the correction factor is between 10 and 100.

10. The method of claim 1, wherein the coding trees for decoding or at least the complete coding tree for decoding of N-bit data words remain stored in a non-volatile memory of the control unit.

* * * * *